United States Patent
Urakawa

(10) Patent No.: US 6,278,300 B1
(45) Date of Patent: *Aug. 21, 2001

(54) I/O INTERFACE CIRCUIT, SEMICONDUCTOR CHIP AND SEMICONDUCTOR SYSTEM

(75) Inventor: Yukihiro Urakawa, Kanagawa-ken (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,034

(22) Filed: Sep. 2, 1998

(30) Foreign Application Priority Data

Sep. 2, 1997 (JP) .................................... 9-237346

(51) Int. Cl.[7] .............................................. H03K 19/0175
(52) U.S. Cl. ........................................... 327/112; 327/333
(58) Field of Search ................................... 327/333, 379, 327/384, 108, 112; 326/30, 62, 63, 68

(56) References Cited

U.S. PATENT DOCUMENTS

| 5,602,494 | * | 2/1997 | Sundstrom | 326/30 |
| 5,731,711 | * | 3/1998 | Gabara | 326/30 |
| 5,781,028 | * | 7/1998 | Decuir | 326/30 |

* cited by examiner

*Primary Examiner*—Tuan T. Lam
(74) *Attorney, Agent, or Firm*—Foley & Lardner

(57) ABSTRACT

A push-pull output buffer contained in an I/O interface circuit of the present invention comprises a P channel MOSFET and a N channel MOSFET. The P channel MOSFET is connected between an I/O node connected to an external circuit through a transmission path and a first potential node to which a first potential is applied. The N channel MOSFET is connected between a second potential node to which a second potential is applied and the I/O node. On/off status of the P channel MOSFET and N channel MOSFET are controlled depending on an input mode for inputting a signal from an external circuit and an output mode for outputting a signal to the external circuit through a transmission path. In this I/O interface circuit, the first and second potentials are terminating potentials, and when input mode is selected, out of the P channel MOSFET and N channel MOSFET, the MOSFET connected to a potential node to which a terminating potential is applied is controlled to be always on.

14 Claims, 10 Drawing Sheets

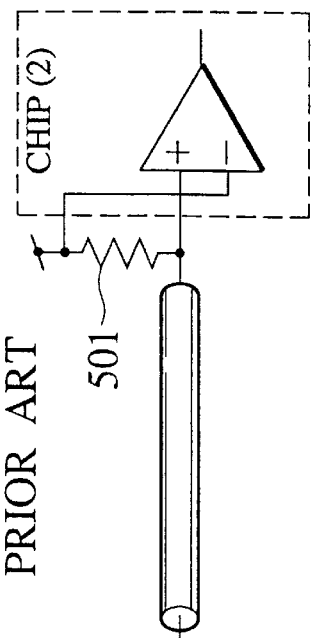
FIG.2A
PRIOR ART
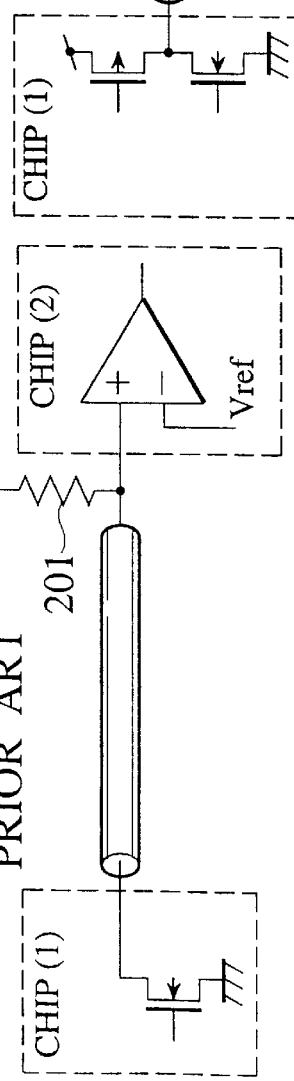
FIG.2B
PRIOR ART
FIG.2C
PRIOR ART
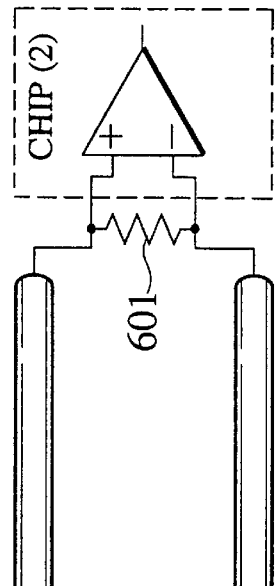
FIG.2D
PRIOR ART
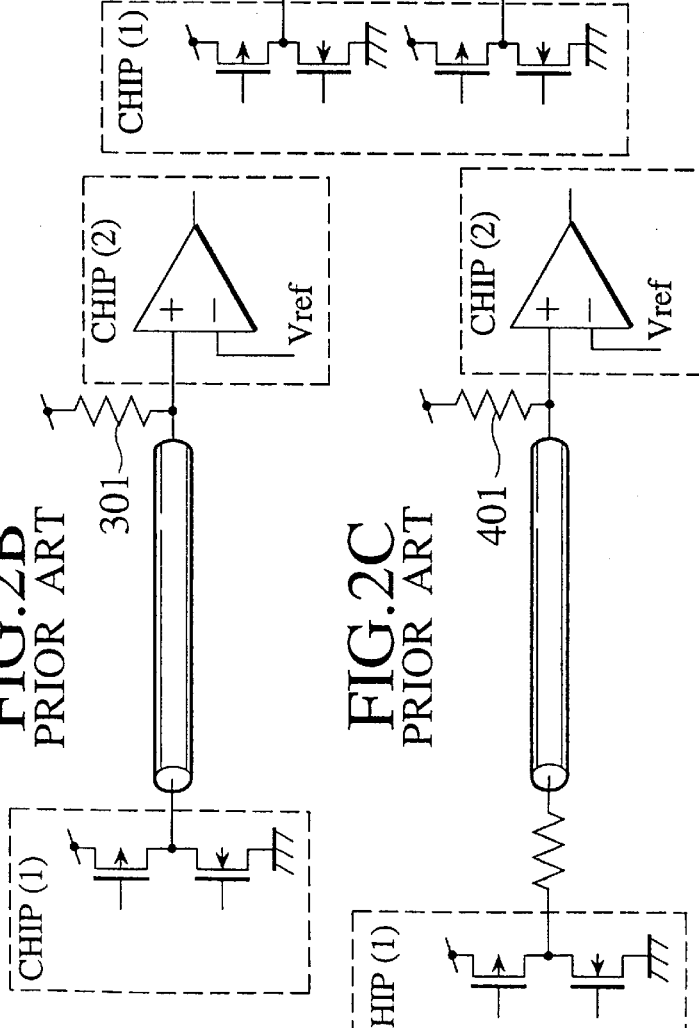
FIG.2E
PRIOR ART

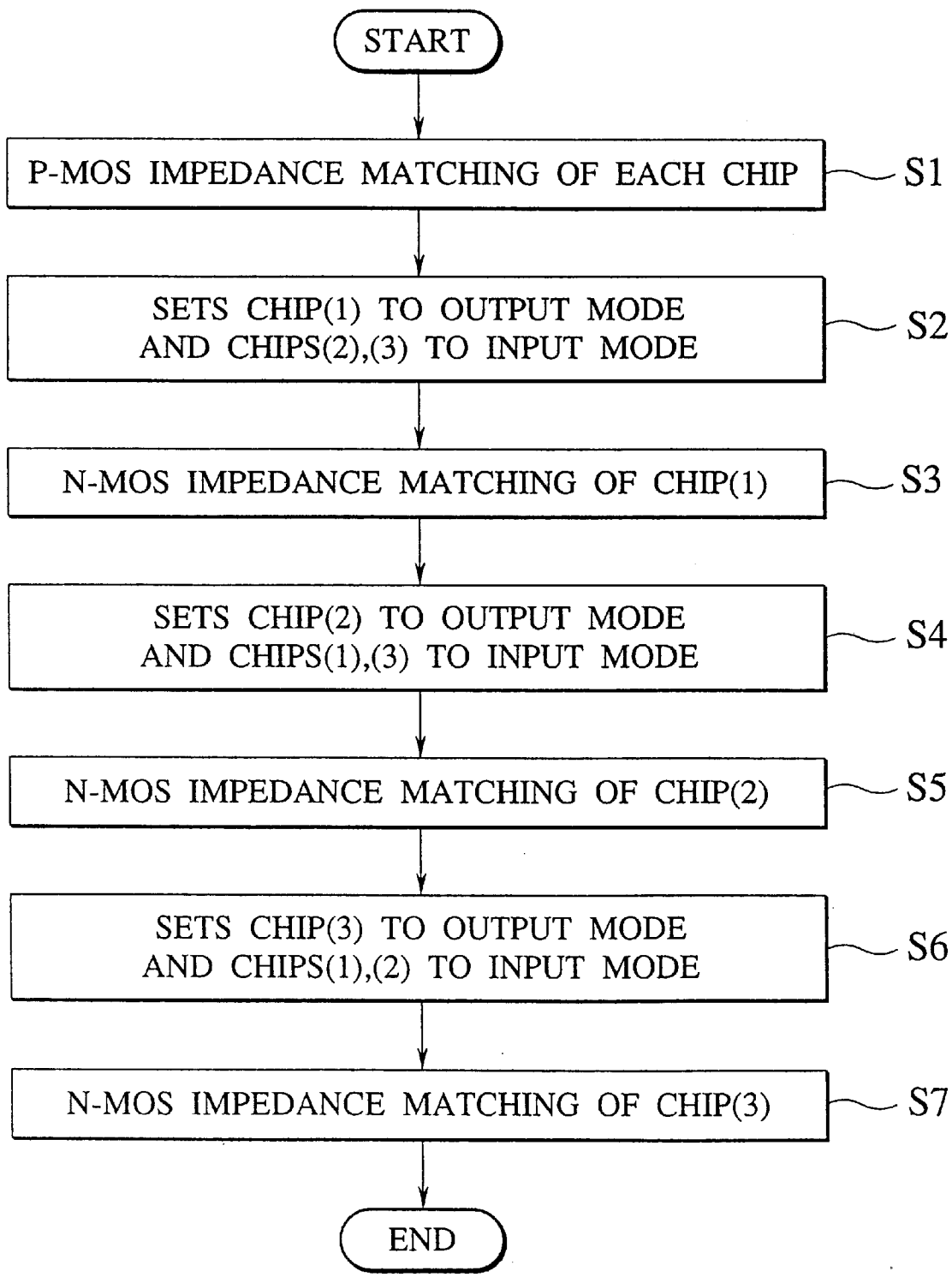

I/O INTERFACE CIRCUIT, SEMICONDUCTOR CHIP AND SEMICONDUCTOR SYSTEM

BACKGROUND OF THE INVENTION

1. Field of the Invention

This invention relates to an I/O interface circuit capable of carrying out rapid data transmission, a semiconductor chip having this I/O interface circuit and a semiconductor system provided with a plurality of the semiconductor chips.

2. Description of the Prior Art

In recent years, the performance of high-performance LSI such as a micro processor has been rising rapidly. This rise of the performance is supported by application of high frequency internal clock by process scaling or introduction of pipeline method.

On the other hand, currently, signal transmission between chips cannot meet this application of high frequency internal clock inside the chip sufficiently. In a conventional TTL/LV-TTL I/O interface, signal transmission with high frequency wave of more than 100 MHz is difficult to realize due to crosstalk, simultaneous signal switching noise (SSN), reflection of signal in transmission path and the like. Therefore, the TTL/LV-TTL interface and the like is a bottleneck of the performance of a high performance LSI.

If the signal transmission speed between the chips is not increased, a trend of multiple pins is indispensable for securing a band width, so that this largely influence production, mounting work, and board cost. Therefore, in the high-performance LSI field, an I/O interface capable of high speed signal transmission has been introduced gradually.

FIGS. 1A–1C show a TTL/LV-TTL I/O interface which has been generally used in a conventional art. FIG. 1A is a structure diagram thereof, FIG. 1B is a potential waveform diagram upon "H" level transmission, and FIG. 1C is a current waveform diagram upon "H" level transmission.

When for example, "H" level is transmitted from a chip 110 of TTL to a chip 120 of LV-TTL through a transmission path 101, P channel MOSFET 112 and N channel MOSFET 113 constituting an I/O buffer 111 of the chip 110 are both turned on. As a result, current flowing through the transmission path 101 changes as shown in FIG. 1C and with an convergence of current amount, the potential is stabilized on VDDQ level as shown in FIG. 1B. Then, on the side of the chip 120, the "H" level signal of the transmission path 101 is received by a differential amplifier 121.

Because the side of the chip 120 in input mode becomes an open end in this I/O interface, signal reflection occurs in the transmission path 101 so that transmission waveform is distorted. Further, because the logical amplitude is large, noise due to dI/dt occurs in high speed operation. Thus, in the high speed I/O interface, generally, the transmission path is terminated.

FIGS. 2A–2E show high speed interface circuits of conventional various terminating types. FIG. 2A shows a GTL/RSL interface, FIG. 2B shows a push-pull type HSTL interface, FIG. 2C shows a SSTL interface, FIG. 2D shows a CTT interface and FIG. 2E shows a LVDS interface.

Because terminating resistors 201, 301, 401, 501, 601 are mounted on a board in the vicinity of the chip 2, if signal is transmitted from the chip 1 to the chip 2, signal reflection at a buffer portion of the chip 2 in input mode is suppressed. Further, because dI/dt can be set small as well as the logical amplitude is small, there does not occur much noise.

FIG. 3 is a structure diagram showing a conventional high-speed interface circuit disclosed in Japanese Patent Application Laid-Open No.8-204539.

In the same Figure, reference numeral 710 denotes a transmission path, numerals 711–714 denote a terminating resistor, numerals 720, 730, 740, 750 denote a chip, numeral 731 denotes a resisting element control means, and numerals 732, 733 denote an on chip terminating means comprising N-MOSFET.

Because in an open drain I/O interface circuit, a large reflection occurs in the transmission path when that circuit is driven from "L" level to "H" level, in this example, the signal sending side is driven by a push-pull buffer (on chip terminating resistor means 732, 733) complementarily so as to keep the sending side chip end of the transmission path 710 from being open.

However, the above first conventional I/O interface circuit has such a problem that a terminating resistor is required to be provided on the board to prevent reflection by an open end thereby producing a high cost.

Although in the respective examples shown in FIGS. 2A–2E, the description is made on an assumption of transmission of a signal in a single direction between two chips, in case of both-way transmission of a signal between two chips, the terminating resistor is required to be inserted in the vicinity of each chip (parallel termination). This reason is that if signal transmission is carried out from the chip 2 to the chip 1, the side of the chip 1 becomes an open end so that a distortion of waveform due to reflection occurs. In such a parallel termination, in the conventional example, two terminating resistors are needed on the board.

Further, in an ordinary system, as well as a point-to-point connection shown in the conventional example, branch/stub connections each having a branch in transmission path have been widely used. In this case, if the parallel termination is carried out to prevent reflection by the open end, in the conventional example, a same number of terminating resistors as that of chips are required to be mounted on the board.

In the aforementioned patent case, the terminating resistors 711–714 on the transmission path cannot be removed.

As described above, if it is intended to realize a high speed I/O interface circuit with terminating system according to the conventional art, it is necessary to provide the terminating resistors on the board. Thus, there is a problem in system cost and the like.

SUMMARY OF THE INVENTION

Accordingly, the present invention has been made to solve the above problem, and therefore an object of the invention is to provide a low cost I/O interface circuit not necessitating the provision of terminating resistor on a board. Another object of the present invention is to provide a semiconductor chip capable of automatically performing impedance matching between the push-pull buffer and transmission path, and a semiconductor system loaded with a plurality of the semiconductor chips.

To achieve the above object, there is provided an I/O interface circuit comprising a push-pull output buffer having: a first driving element connected between an I/O node connected to an external circuit through a transmission path and a first potential node to which a first potential is applied; and a second driving element connected between a second potential node to which a second potential is applied and the I/O node, wherein on/off status of the first and second driving elements are controlled corresponding to an input mode for inputting a signal from the external circuit and an output mode for outputting a signal to the external circuit through the transmission path, the I/O interface circuit being further so constructed that the first or second potential is terminal potential and when the input mode is selected, a driving element connected to a potential node to which the terminal potential is applied, of the first and second driving elements, is controlled so as to be turned on.

According to the first aspect of the invention, because the driving element connected to the potential node to which the terminating potential of the push-pull output buffer in input mode is applied is controlled so as to be always on, the driving element acts as a terminating element on the transmission path thereby absorbing a reflection of a signal on the transmission path.

Further, to achieve the above object, there is provided an I/O interface circuit comprising: a push-pull output buffer supplied with first and second potentials and having an output node connected to an external circuit through a transmission path; and a switch element connected between the output node of the push-pull output buffer and a third potential which is a terminal potential, wherein when input mode for inputting a signal from the external circuit through the transmission path is selected, the switch element is controlled so as to be turned on.

According to the second aspect of the invention, because the switch connected to the terminal potential is controlled so as to be on when input mode is selected, the transmission path is terminated thereby a reflection of a signal on the transmission path being absorbed.

Further, to achieve the above object, there is provided an I/O interface circuit comprising: first and second push-pull buffers each supplied with first and second potentials and each having output node connected to an external circuit through first and second transmission paths; a switch element connected between output nodes of the first and second push-pull output buffers, wherein when input mode for inputting a signal from the external circuit through the first and second transmission paths is selected, the switch element is controlled so as to be turned on.

According to the third aspect of the invention, because the switch element connected between the output nodes of the two push-pull output buffers is controlled so as to be on when input mode is selected, the transmission path is terminated thereby a reflection of signal on the transmission path being absorbed.

Further, to achieve the above object, there is provided a semiconductor chip comprising: the I/O interface circuit according to the first aspect; a replica of the push-pull output buffer according to the first aspect; an impedance element on a board, connected between an external pin connected to an output end of the replica and the second potential; a first element impedance determining means for comparing a potential appearing in the external pin to which the impedance element is connected, with an output logic potential of the reference potential generating circuit and for determining an impedance value of the first driving element in the push-pull output buffer according to a result of the comparison; and a second element impedance determining means for comparing an output logic potential of the transmission path with the output logic potential of the reference potential generating circuit and for determining an impedance value of the second driving element in the push-pull output buffer according to a result of the comparison.

According to the fourth aspect, an impedance value of a first driving element in the push-pull output buffer is determined using an impedance element on the board, connected between the external pin and second potential. Further, an output logical potential of the transmission path is monitored and an impedance value of a second driving element in the push-pull output buffer is determined. As a result, an impedance value of a driving element of the push-pull output buffer can be controlled so as to generate an appropriate output potential.

According to a preferred embodiment of the present invention, an impedance of the impedance element is equal to an impedance of the transmission path.

Further, to achieve the above object, there is provided a semiconductor system comprising: a plurality of semiconductor chips according to the fourth aspect, connected through the transmission path; and a control means for controlling an output impedance of the plurality of the semiconductor chips according to the fourth aspect so as to match with an impedance of the transmission path.

According to a preferred embodiment of the present invention, the control means is a sequencer for executing impedance matching at the time of boot and at a predetermined time.

Further, to achieve the above object, there is provided a semiconductor chip comprising: the I/O interface circuit according to the second aspect; a replica of the push-pull output buffer according to the second aspect; a reference potential generating circuit for generating an output logic potential; an impedance element on a board, connected between an external pin connected to an output end of the replica and the second potential; a first element impedance determining means for comparing a potential appearing in the external pin to which the impedance element is connected, with an output logic potential of the reference potential generating circuit and for determining an impedance value of a driving element connected to a potential node supplied with the first potential in the push-pull output buffer according to a result of the comparison; and a second element impedance determining means for comparing an output logic potential of the transmission path with an output logic potential of the reference potential generating circuit and for determining an impedance value of a driving element connected to a potential node supplied with the second potential in the push-pull output buffer according to a result of the comparison.

According to the sixth aspect of the invention, in the interface state of the second aspect, the same impedance automatic adjustment function as the fourth aspect is exerted.

According to a preferred embodiment of the invention, the impedance of the impedance element is equal to an impedance of the transmission path.

Further, to achieve the above object, there is provided a semiconductor system comprising: a plurality of semiconductor chips according to the sixth aspect, connected through the transmission path; and a control means for controlling an output impedance of the plurality of the semiconductor chips according to the sixth aspect so as to match with an impedance of said transmission path.

According to a preferred embodiment of the invention, the control means is a sequencer for executing impedance matching at the time of boot and at a predetermined time.

Further, to achieve the above object, there is provided a semiconductor chip comprising: the I/O interface circuit according to the third aspect; a replica of the first and second push-pull output buffer according to the third aspect; a reference potential generating circuit for generating an output logic potential; an impedance element on a board, inserted between an external pin connected to an output end of the replica and said second potential; and an element impedance determining means for comparing a potential appearing in the external pin to which the impedance element is connected, with an output logic potential of the reference potential generating circuit and for determining an impedance value of a driving element connected to a potential node supplied with the first potential in the first and second push-pull output buffers according to a result of the comparison.

According to the eight aspect of the invention, in the interface state of the third aspect, the same impedance automatic adjustment function as the fourth aspect is exerted.

According to a preferred embodiment of the present invention, an impedance of the impedance element is equal to an impedance of the transmission path.

Further, to achieve the above object, there is provided a semiconductor system comprising: a plurality of semiconductor chips according to the eighth aspect, connected through the transmission path; and a control means for controlling an output impedance of the plurality of the semiconductor chips according to the eighth aspect so as to match with an impedance of the transmission path.

According to a preferred embodiment of the invention, the control means is a sequencer for executing impedance matching at the time of boot and at a predetermined time.

The nature, principle and utility of the invention will become more apparent from the following detailed description when read in conjunction with the accompanying drawings.

BRIEF DESCRIPTION OF THE DRAWINGS

In the accompanying drawings:

FIGS. 2A–2E are structure diagrams showing high speed interface circuits of conventional various terminating systems;

FIG. 10 is a sequence diagram of a case in which the fifth embodiment is applied to branch/stub connection of three chips.

DESCRIPTION OF THE PREFERRED EMBODIMENTS

Figure 4:
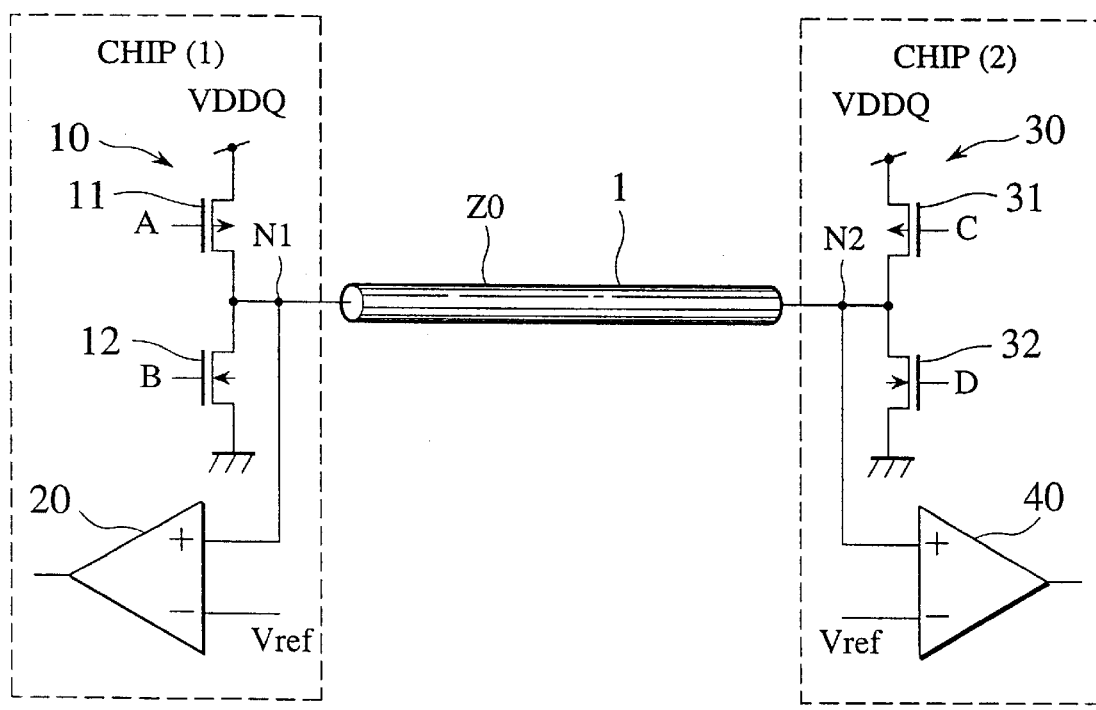
FIG. 4 is a circuit diagram showing a push-pull type HSTL interface according to a first embodiment of the present invention.

Hereinafter, the embodiment of the present invention will be described with reference to the drawings. FIG. 4 is a structure diagram showing an I/O interface circuit (push-pull type HST interface) according to a first embodiment of the present invention.

In this embodiment, for simplification of description, it is assumed that both-way, point-to-point data transmission is carried out between two chips.

As shown in FIG. 4, a chip 1 and a chip 2 are connected to each other through a transmission path 1 having impedance Z0. According to the push-pull type HST interface of the embodiment, the chip 1 contains a push pull output buffer 10 for signal output and a differential amplifier 20 for signal input. Likewise, the chip 2 contains a push-pull output buffer 30 for signal output and a differential amplifier 40 for signal input.

The push-pull output buffer 10 of the chip 1 comprises a P-channel MOSFET 11 connected between an I/O node N1 to which an end of the transmission path 1 is connected and VDDQ potential (first potential) and a N-channel MOSFET 12 connected between ground GND potential (second potential) and the aforementioned I/O node N1.

Likewise, the push-pull output buffer 30 of the chip 2 comprises a P-channel MOSFET 31 connected between an I/O node N to which the other end of the transmission path 1 is connected and VDDQ potential and a N-channel MOSFET 32 connected between the ground GND potential and the aforementioned I/O node N2.

A positive terminal (+) of the differential amplifier 20 is connected to the I/O node N1 of the chip 1 and reference potential Vref is applied to a negative terminal (−) thereof. Further, output terminals of the differential amplifiers 20, 40 are connected to internal circuits 1, 2 (not shown), respectively.

The FETs 11, 12 of the output buffer 10 of the chip 1 are turned on/off by each control signal A, B and the FETs 31, 32 of the output buffer 30 of the chip 2 are turned on/off by each control signal C, D. According to the present invention, by devising the control method of this output buffer, a high-performance push-pull type HSTL interface is realized without mounting a terminating element on a board.

Hereinafter, operations [A], [B] for data transmission according to this embodiment will be described mainly about the control method of the output buffers 10, 30.

[A] Data transmission from the chip 1 to the chip 2

In case of data transmission from the chip 1 to the chip 2, the output buffers 10, 30 of the chips 1, 2 are set to output mode (active) and input mode (disabled) respectively.

In case of data transmission of logic "H", the control signal A becomes "L" level and the control signal B becomes "H" level. At the same time, the control signals C, D become "L" level. As a result, the FETs 11, 12 of the output buffer 10 is turned on while the FET 31 of the output buffer 30 is turned on and the FET 32 is turned off.

In case of data transmission of logic "L", the control signal A becomes "H" level and the control signal B becomes "L" level while the control signals C, D become "L" level. As a result, the FETs 11, 12 of the output buffer 10 are turned off, while the FET 31 of the output buffer 30 is turned on and the FET 32 is turned off.

[B] Data transmission from the chip 2 to the chip 1

In case of data transmission from the chip 2 to the chip 1, the output buffers 10, 30 of the chips 1, 2 are set to input mode and output mode, respectively.

In case of data transmission of logic "H", the control signals A, B become "L" level. At the same time, the control signal C becomes "L" level and the control signal D becomes "H" level. As a result, the FET 11 of the output buffer 10 is turned on and the FET 12 is turned off. The FETs 31, 32 of the output buffer 30 are turned on.

In case of data transmission of logic "L", the control signals A, B become "L" level while the control signal C becomes "H" level and the control signal D becomes "L" level. As a result, the FET 11 of the output buffer 10 is turned on and the FET 12 is turned off. The FETs 31, 32 of the output buffer are both turned off.

As state above, the pull-up element (FETs 11, 31) on the side of a chip to be in input mode is always controlled to be on. Consequently, by on-resistance of this pull-up element, the pull-up element makes a role of a terminating element to the VDDQ of the transmission path 1. That is, the chip side in input mode is controlled not so as to be open.

Therefore, although a terminating resistor is required to be attached to the board as a signal reflection preventing measure in a conventional push-pull type HST1 interface described above, according to this embodiment, the high-performance push-pull type HSTL interface can be achieved without attaching this terminating resistor.

Here, considering a reflection of signal in the transmission path 1, it is desirable that the FETs 11, 12, 31, 32 of the output buffers 10, 30 are matched with the transmission path 1 in terms of impedance. In an ideal case, the output logical level and output current are as follows.

That is, in case when the logic "H" is output, the output potential (typical) is VDDQ and output current is 0. In case when the logic "L" is output, the output potential (typical) is VDDQ/2 and output current is VDDQ/(2×Z0). Where Z0 is an impedance of the transmission path 1.

In a word, in case of transmitting a signal in both ways between two chips, it has been ideal to insert (parallel termination) a terminating resistor in the vicinity of each chip according to the conventional art. The reason is that in a case of the aforementioned HSTL interface of FIG. 2B, when signal is transmitted from the chip 2 to the chip 1, the chip 1 becomes an open end so that a distortion of waveform is generated due to the reflection. In the case of parallel termination, two terminating resistors are needed on the board in the conventional art.

On the other hand, because according to this embodiment, the data receiving side is always controlled so as to be terminated, no terminating resistor is required on the transmission path. Further, the output current can be reduced thereby making it possible to suppress an increase of power.

If speaking of an effect of this output current reduction in a concrete way, although the output current becomes 0 in this embodiment as well as in the conventional example when the logic "H" is output, when the logic "L" is output, it becomes VDDQ/(2×Z0) in this embodiment while it becomes VDDQ/Z0 in the conventional example.

Although the above description is on the premise that the terminating potential is VDDQ, the terminating potential can be GND. An operation of that case is as follows.

In case of transmitting data of the logic "H" from the chip 1 to the chip 2, the control signal A becomes "L" level and the control signal B becomes "H" level. At the same time, the control signals C, D become "H" level. As a result, the FETs 11, 12 of the output buffer 10 are turned on, and the FET 31 of the output buffer 30 is turned off and the FET 32 is turned on.

In case of transmitting data of logic "L", the control signal A becomes "H" level and the control signal B becomes "L" level and at the same time, the control signals C, D become "H" level. As a result, the FETs 11, 12 of the output buffer 10 are both turned off, and the FET 31 of the output buffer 30 is turned off and the FET 32 is turned on.

In case of transmitting data of logic "H" from the chip 2 to the chip 1, the control signals A, B become "H" level. At the same time, the control signal C becomes "L" level and the control signal D becomes "H" level. As a result, the FET 11 of the output buffer 10 is turned off and the FET 12 is turned on. The FETs 31, 32 of the output buffer 30 are both turned on.

In case of transmitting data of logic "L", the control signals A, B become "H" level and at the same time, the control signal C becomes "L" level and the control signal D becomes "H" level. As a result, the FET 11 of the output buffer 10 is turned off and the FET 12 is turned on. The FETs 31, 32 of the output buffer 30 are turned off.

As described above, the pull-down elements (FETs 12, 32) of the output buffer in input mode are controlled so as to be always on. Therefore, this pull-down element takes a role as a terminating element to terminate the transmission line 1 to GND.

In this case, a relation between the output logical level and output current is desired to be as follows. That is, in case when the logic "H" is output, the output potential (typical) is VDDQ/2 and output current is VDDQ/(2×Z0). In case when the logic "L" is output, the output potential (typical) is GND and output current is 0.

Figure 5:
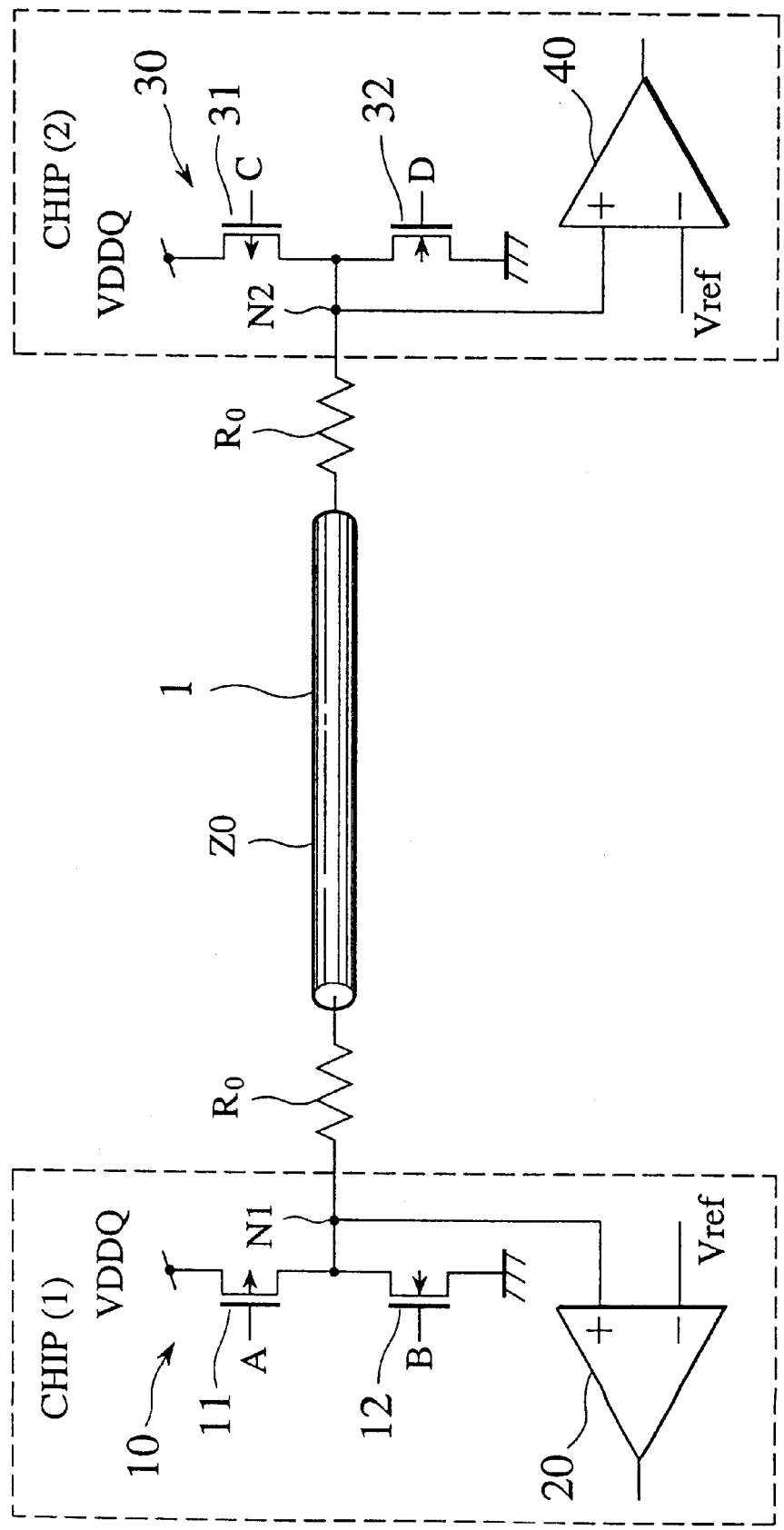
FIG. 5 is a diagram showing an example of a SSTL interface.

With SSTL interface in which a resistor Ro is inserted between each transmission end and I/O nodes N1, N2 of each chip 1, 2 as shown in FIG. 5 as well, a high speed I/O interface can be achieved by carrying out the same control without mounting any terminating resistor on the board.

Next, a second embodiment of the present invention will be described.

Although the first embodiment is an example of point-to-point connection, in this embodiment, examples of branch connection and stub connection will be described.

Figure 6:
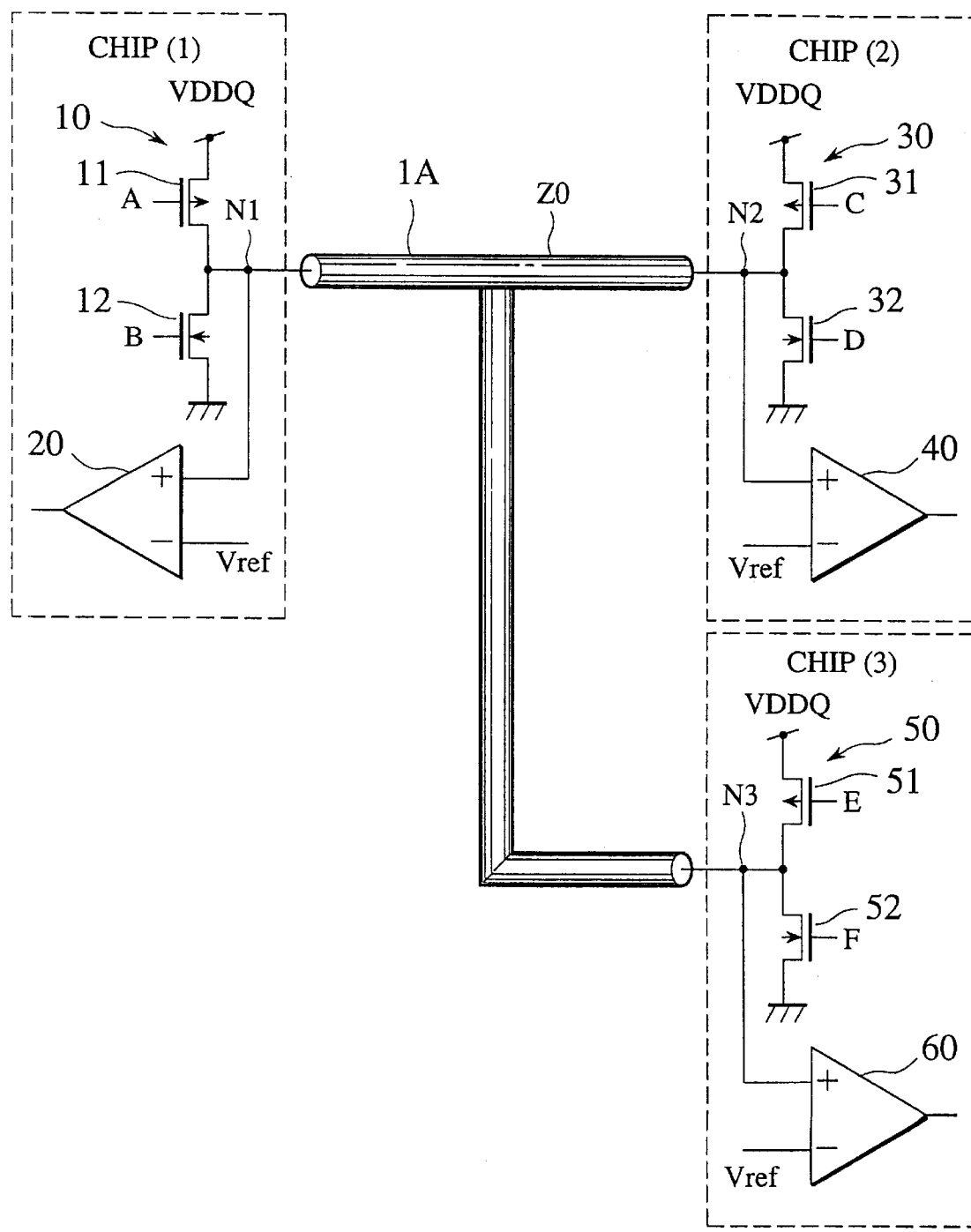
FIG. 6 is a circuit diagram showing an I/O interface circuit according to a second embodiment of the present invention.

FIG. 6 is a structure diagram showing an I/O interface circuit according to a second embodiment of the present invention.

Figure 1A:
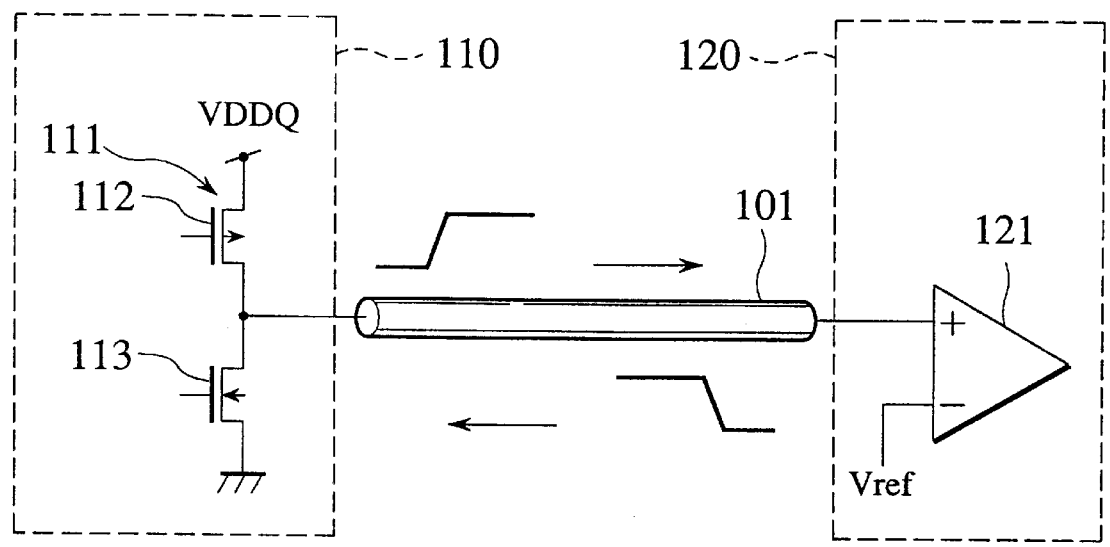
FIGS. 1A–1C are structure diagrams showing a conventional I/O interface circuit, etc.
Figure 1B:
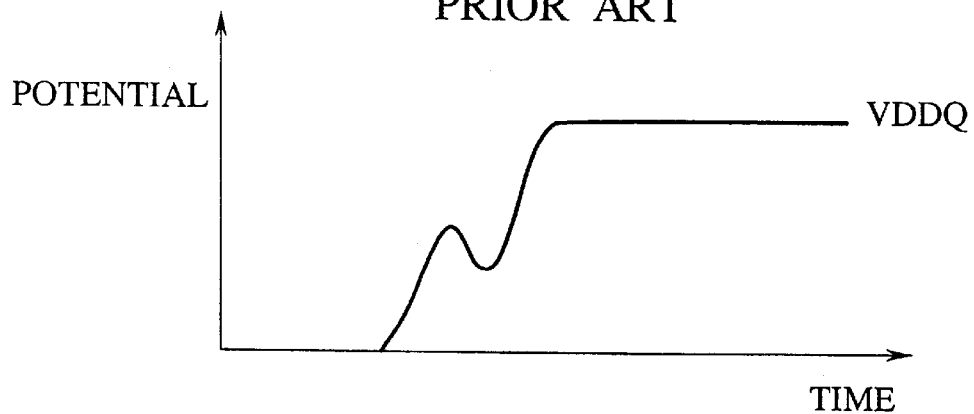
Figure 1C:
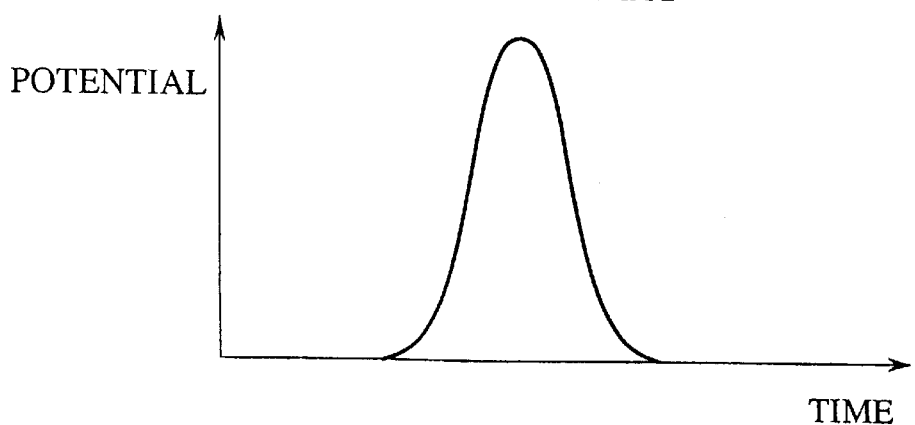
Figure 3:
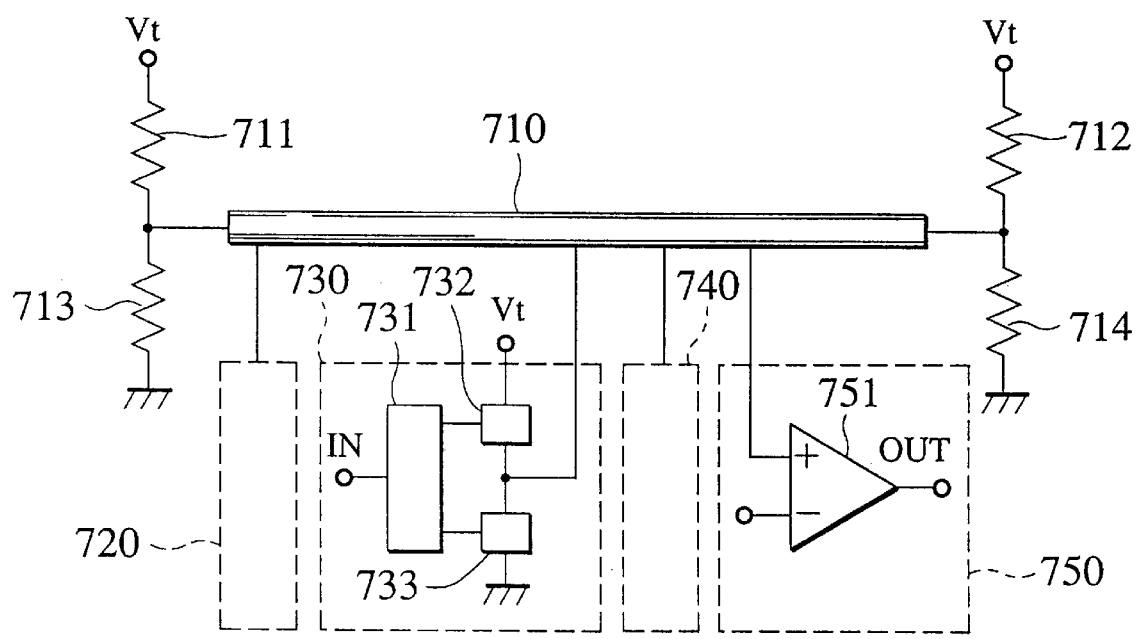
FIG. 3 is a structure diagram showing a high speed interface circuit disclosed in Japanese Patent Application Laid-Open No.8-204539.

As shown in the same Figure, the chips 1, 2 and 3 are connected to each of three ends of a transmission line 1A branched to two ways at a mid-point through I/O nodes N1, N2, N3. An output buffer 50 of the chip 3 connected to the I/O node N3 has the same structure as the chips 1, 2 shown in FIG. 1. That is, this is constituted in push-pull system of P channel MOSFET 51 and N channel MOSFET 52. The FETs 51, 52 are turned on/off by the control signals E and F respectively. Reference numeral 60 denotes a differential amplifier of the chip 3.

Hereinafter, data transmission operations A, B, C of this embodiment will be described mainly about control method of the output buffers 10, 30, 50.

[A] Data transmission from the chip 1 to the chips 2, 3

In case of data transmission from the chip 1 to the chips 2, 3, the output buffer 10 of the chip 1 is set to output mode and the output buffers 30, 50 of the chips 2, 3 are set to input mode.

In case of data transmission of logic "H", the control signal A becomes "L" level, the control signal B becomes "H" level and the control signals C, D and control signals E, F become "L" level. As a result, the FETs 11, 12 of the output buffer 10 are turned on while the FET 31 of the output buffer 30 is turned on and the FET 32 is turned off. Likewise, the FETs 51, 52 of the output buffer 50 are turned on and off respectively.

In case of data transmission of logic "L", the control signal A becomes "H" level and the control signal B becomes "L" level. The others are the same as transmission of "H" level. As a result, the FETs 11, 12 of the output buffer 10 are turned off. The others are the same as transmission of "H" level.

[B] Data transmission from the chip 2 to the chips 1, 3

In case of data transmission from the chip 2 to the chips 1, 3, the output buffer of the chip 2 is set to output mode and the output buffers 10, 50 of the chips 1, 3 are set to input mode.

In case of data transmission of logic "H", the control signals C, D become "L" level and "H" level. The other control signals A, B and control signals E, F become "L" level. As a result, the FETs 31, 32 of the output buffer 30 are turned on and the FET 11 of the output buffer 10 is turned on and the FET 12 is turned off. Likewise, the FETs 51, 52 of the output buffer 50 are turned on and off respectively.

In case of data transmission of logic "L", the control signal A becomes "L" level and control signal B becomes "H" level. The others are the same as transmission of "H" level. As a result, the FETs 31, 32 of the output buffer 30 are turned off and the others are the same as transmission of "H" level.

[C] Data transmission from the chip 3 to the chip 1, 2

In case of data transmission from the chip 3 to the chips 1, 2, the output buffer 50 of the chip 3 is set to output mode and the output buffers 10, 30 of the chips 1, 2 are set to input mode.

In case of data transmission of logic "H", the control signals E, F become "L" level and "H" level respectively, and the other control signals A, B and C, D become "L" level. As a result, the FETs 51, 52 of the output buffer 50 are turned on, and the FET 11 of the output buffer 10 is turned on and the FET 12 is turned off. Likewise, the FETs 31, 32 of the output buffer 30 are turned on and off respectively.

In case of data transmission of logic "L", the control signals E, F become "H" level and "L" level respectively and the others are the same as transmission of "H" level. As a result, the FETs 51, 52 of the output buffer 50 are turned off and the others are the same as transmission of "H" level.

By controlling the output buffer of the input mode chip so that an element for outputting a potential at the terminating end is turned on, parallel termination is possible in branch connection of three or more chips.

To carry out parallel termination to prevent a reflection at the open end, in the conventional example, the terminating resistors are required to be mounted on the board in the same quantity as that of the chips. However, according to this embodiment, no terminating resistors are required to be mounted on the board as described above.

To adjust the output level by impedance matching at the transmission line end and hold an output logical level, the impedance Z of the output "L" level drive FET needs to be such a value obtained by a following formula.

$$Z=Z0/(n-1)$$

where:

n: number of chips

Z0: impedance of transmission line 1A

Further, output current I at that time can be obtained by a following formula.

$$I=VDDQ \times (n-1)/(2 \times Z0)$$

Although a case in which the terminated voltage is VDDQ has been stated in the above description, it is permissible that the GND is a terminal potential. A control at that time is evident from the first embodiment, and therefore a description thereof is omitted.

Next, a third embodiment of the present invention will be described.

This embodiment applies a concept of the present invention with the LVDS interface as its base.

Figure 7:
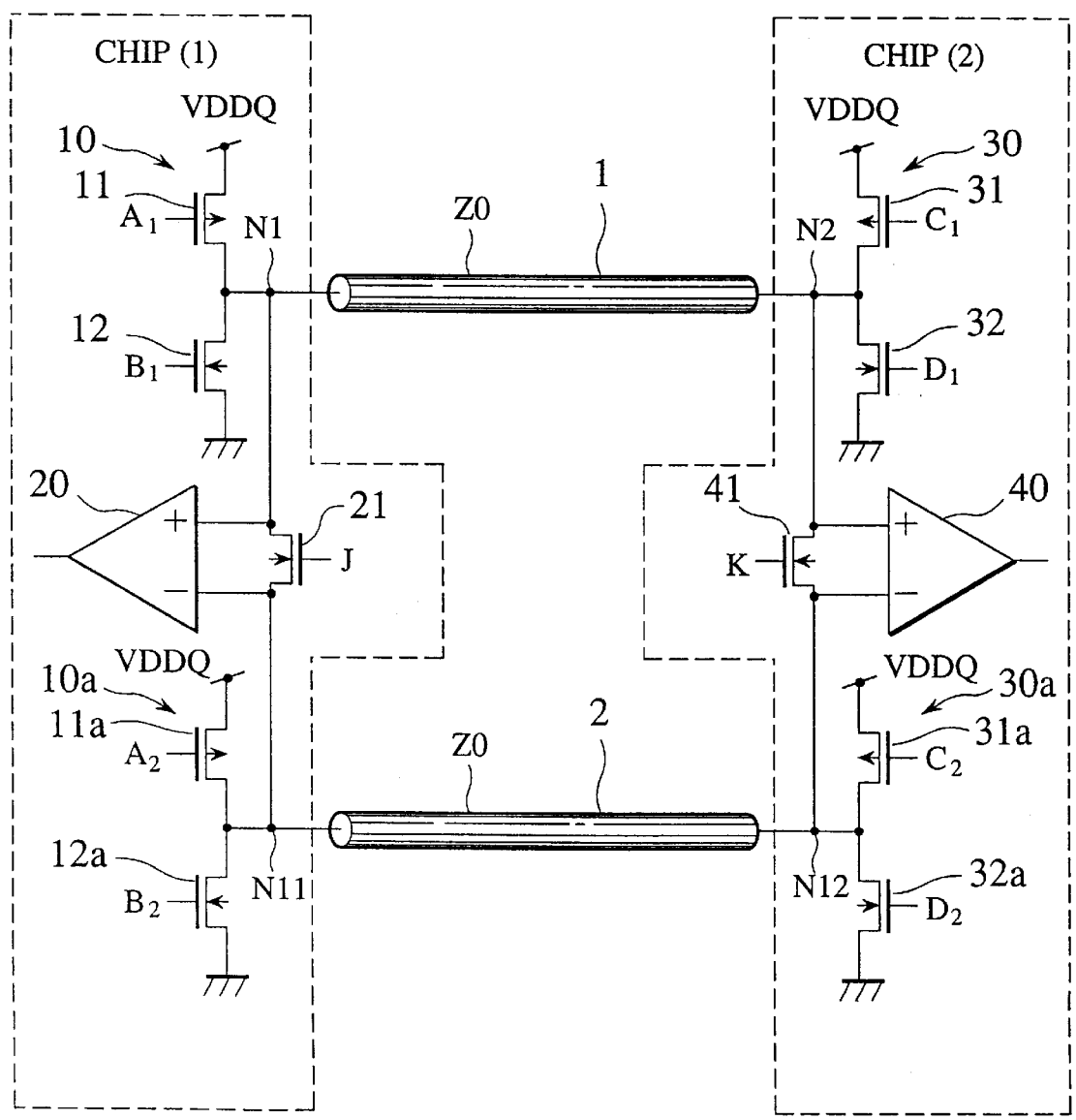
FIG. 7 is a circuit diagram showing an I/O interface circuit according to a third embodiment of the present invention.

FIG. 7 is a structure diagram showing an I/O interface circuit according to the third embodiment of the present invention.

As shown in the same Figure, the chips 1, 2 are connected to each other through the transmission paths 1, 2 of the impedance Z. As for the I/O interface circuit of this embodiment, the chip 1 comprises two push-pull output buffers 10, 10a and a differential amplifier 20 for signal input. I/O nodes N1, N11 of the output buffers 10, 10a are connected to a positive terminal and negative terminal of the differential amplifier 20, respectively. An N channel MOSFET 21 which is a switch element is connected between the positive terminal and negative terminal.

The chip 2 has the same structure, containing two push-pull output buffers 30, 30a, differential amplifier 40 for signal input, and an N channel MOSFET 41 which is a switch element corresponding to the aforementioned FET 21.

The FETs 11, 12 constituting the output buffer 10 of the chip 1 are on/off controlled by control signals A1, B1 respectively and the FETs 11a, 12a constituting an output buffer 10a are on/off controlled by control signals A2, B2 respectively. The FETs 31, 32 constituting an output buffer 30 of the chip 2 are on/off controlled by control signals C1, D1 respectively and the FETs 31a, 32a constituting an output buffer 30a are on/off controlled by control signals C2, D2 respectively. The FETs 21, 41 are switching-controlled by control signals J, K respectively.

Hereinafter, data transmission operations A, B of this embodiment will be described mainly about control method of the output buffers 10, 10a, 30, 30a.

[A] Data transmission from the chip 1 to the chip 2

In case of data transmission from the chip 1 to the chip 2, the output buffers 10, 10a of the chip 1 are set to output mode and the output buffers 30, 30a of the chip 2 are set to input mode.

In case of data transmission of logic "H", the control signals A1, B1 become "L" level and the control signals A2, B2 become "H" level and the control signal J becomes "L" level. At the same time, the control signals C1, D1 become "H" level and "L" level. The control signals C2, D2 become "H" level and "L" level respectively, and the control signal K becomes "H" level.

As a result, the FETs 11, 12 of the output buffer 10 are turned on and off respectively, and the FETs 11a, 12a of the output buffer 10a are turned off and on respectively. On the other hand, the FETs 31, 32, 31a, 32a of the output buffers 30, 30a are all turned off.

The FET 21 of the chip 1 is turned off and the FET 41 of the chip 2 is turned on.

On the other hand, in case of data transmission of logic "L", the control signals A1, B1 and control signals A2, B2 are reversed relative to transmission of "H" level and all other control signals C1, D1, C2, D2, J, K are the same as transmission of "H" level.

As a result, the FETs 11, 12 of the output buffer 10 are turned off and on respectively, and the FETs 11a, 12a of the output buffer 10a are turned on and off respectively. On the other hand, the FETs 31, 32, 31a, 32a of the output buffers 30, 30a are all turned off. The FET 21 of the chip 1 is turned off and the FET 41 of the chip 2 is turned on.

[B] Data transmission from the chip 1 to the chip 2

In case of data transmission from the chip 2 to the chip 1, the output buffers 10, 10a of the chip 1 are set to input mode and the output buffers 30, 30a of the chip 2 are set to output mode.

In case of data transmission of logic "H", the control signals A1, B1 and control signals A2, B2 become "H" level and "L" level respectively and the control signal J becomes "H" level. At the same time, the control signals C1, D1 become "L" level and the control signals C2, D2 become "H" level and the control signal K becomes "L" level.

As a result, the FETs 11, 12, 11a, 12a of the output buffers 10, 10a are all turned off. On the other hand, the FETs 31, 32 of the output buffer 30 become "H" level and "L" level respectively. The FETs 31a, 32a of the output buffer 30a become "L" level and "H" level respectively.

On the other hand, in case of data transmission of logic "L", the control signals C1, D1 and control signals C2, D2 are reversed relative to transmission of "H" level and all other control signals A1, B1, A2, B2, J, K are the same as transmission of "H" level.

As a result, the FETs 11, 12, 11a, 12a of the output buffers 10, 10a are all turned off. The FETs 31, 32 of the output buffer 30 are turned off and on respectively, and the FETs 31a, 32a of the output buffer 30a are turned on and off respectively. Then, the FET 21 of the chip 1 is turned on and the FET 41 of the chip 2 is turned off.

Because according to this embodiment, the FET 21 or 41 in input mode is controlled so as to be turned on, the transmission paths 1, 2 are terminated by this FET on-resistance. Therefore, it is not necessary to mount a terminating resistor on the board.

According to this embodiment, even at the time of branch connection or stub connection, a high speed LVDS-type I/O interface can be achieved without mounting the terminating resistor on the board by the same control as described above.

Next, a fourth embodiment of the present invention will be described.

This embodiment applies a concept of the present invention with the CTT interface as its base.

Figure 8:
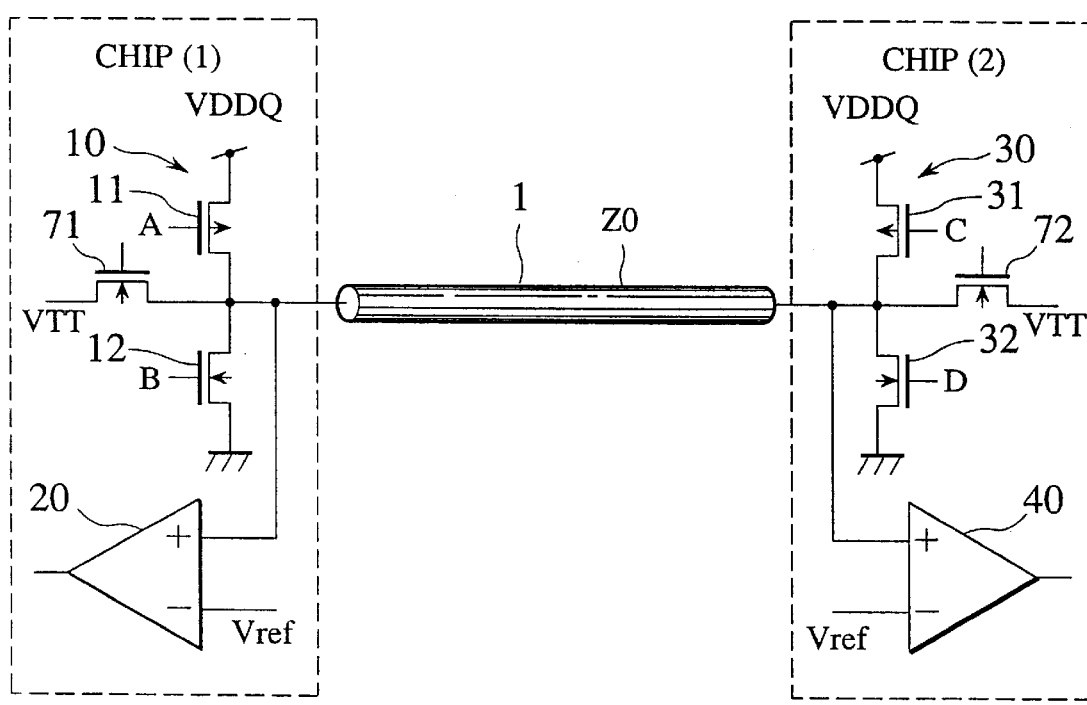
FIG. 8 is a circuit diagram showing an I/O interface circuit according to a fourth embodiment of the present invention.

FIG. 8 is a structure diagram showing an I/O interface circuit according to the fourth embodiment of the present invention.

According to this embodiment, in a circuit shown in FIG. 4 of the first embodiment, a switch 71 is inserted between the I/O node N1 and terminal potential VTT and likewise, a switch 72 is inserted between the I/O node N2 of the chip 2 and terminal potential VTT.

According to this embodiment, in case of data transmission from the chip 1 to the chip 2 or from the chip 2 to the chip 1, when the output buffers 10, 30 are in input mode, the switch elements 71, 72 are turned on. As a result, the transmission path 1 is terminated, so that the terminating resistor is not required to be mounted on the board.

Next, a fifth embodiment of the present invention will be described.

As described above, considering a reflection of signal in the transmission path, it is desirable that the push-pull transistor of each output buffer is matched with the transmission path in impedance. This embodiment shows an example of an I/O interface circuit of the first embodiment containing an automatic impedance adjusting function for automatically matching in the impedance.

Figure 9:
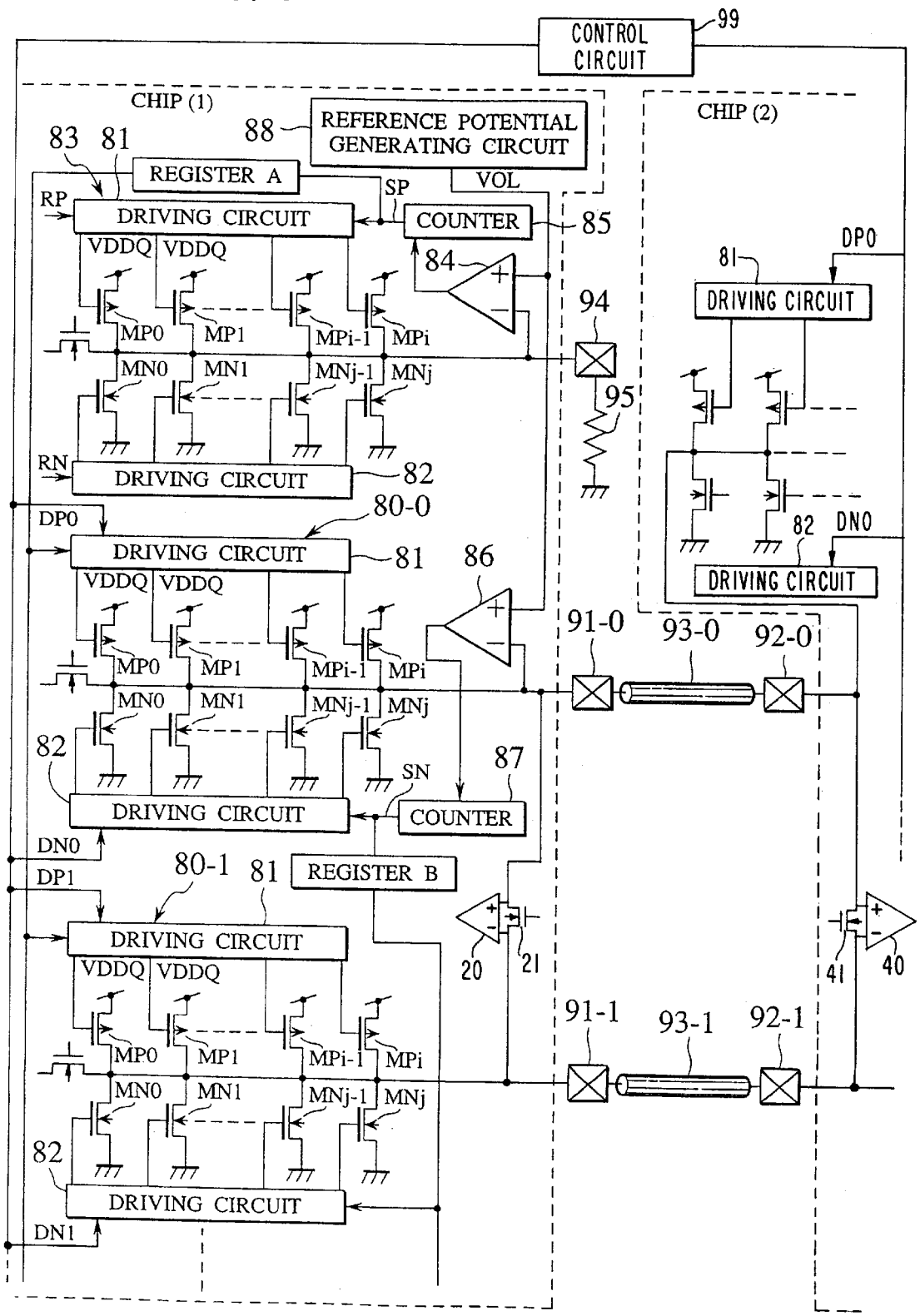
FIG. 9 is a major part circuit diagram showing a semiconductor system according to a fifth embodiment of the present invention.

FIG. 9 shows a major part structure diagram showing a semiconductor system according to the fifth embodiment.

This semiconductor system has the chips 1, 2. The chips 1, 2 are connected to each other by a plurality of transmission paths 93-0, 93-1, . . . through external pins 91-0, 91-1, . . . , 92-0, 92-1, . . .

The I/O interface circuit of the chip 1 respectively contains output buffer portions 80-0, 80-1, . . . respectively connected to the external pins 91-0, 91-1, . . . The output buffer portions 80-0, 80-1, . . . comprise output buffers in which plural P channel MOSFETs (MP0, MP1, . . . MPi-1, MPi) and plural N channel MOSFETs (MN0, MN1, . . . NNj-1, MNj) are push-pull connected, and driving circuits 81, 82 for driving the P-MOSFETs(MP0-MPi) and N-MOSFETs (NM0–MNj).

As for the size of the MOSFET, if the sizes of MPk, MNk of k MOSFET are WP(k) and WN(k), the size of the MOSFET can be expressed according to a following formula with reference to the size WP(0), WN(0) of the MP0, MN0 which are minimum size MOSFETs.

$$WP(k) = 2^k \times WP(0) \ (k=0, 1, \ldots I)$$

$$WN(k) = 2^k \times WN(0) \ (k=0, 1, \ldots j)$$

On the other hand, the chip 1 has a replica 83 of the aforementioned output buffer and a reference potential generating circuit 88. The reference potential generating circuit 88 outputs a logical "L" output (=VDDQ/2) VOL produced by dividing a resistance in the chip. An external pin 94 is connected to the replica 83.

The terminal power supply is named VDDQ in the following description. To ensure impedance matching, a resistor 95 equivalent to the impedance of the transmission path is inserted between the external pin 94 and ground GND on the board.

Then, by comparing a voltage produced in the external pin 94 with an output potential VOL of the reference voltage generating circuit 88, the counter 85 is counted up or down depending on which is larger or smaller. Binary output SP of the counter 85 controls active/inactive of the driving circuit 81 of the replica 83 and the output buffers 80-0, 80-1, . . . An effective size of the entire P-MOSFET can be in a range of WP0~$(2^{(i+1)}-1) \times$WP0 (increments each WP0) because the size WP(k) of the k P-MOSFET is expressed as shown above.

As a result, the P-MOSFET size of the output buffers 80-0, 80-1, . . . in which impedance matching of the transmission paths 93-0, 93-1, . . . is ensured, can be determined. Binary data SP generated therein is stored in register A and transmitted to all the output buffer portions 80-0, 80-1, . . . . The size of the P-MOSFET is controlled/determined to be the same as the replica.

Here, control signals DP0, DN0, DP1, DN1, . . . are supplied from a control circuit 99 to the driving circuits 81, 82 of the output buffers 80-1, 80-1, . . . , and each output MOSFET is on/off controlled depending on the input mode/output mode. When the input mode is selected, the P-MOSFETs are turned on as described in the first embodiment.

By carrying out the aforementioned operation for the chips 1, 2, the P-MOSFET serving as a pull-up driver of the output buffer portions 80-0, 80-1, . . . further acts as a terminating resistor to match with the transmission path in impedance.

Next, the size of the N-MOSFET will be adjusted. One of the transmission path for connecting the chip 1 to the chip 2 is defined as for reference. First, the chip 1 is adjusted. The chip 2 is set in input mode, and the reference of the chip 1 is set to output "L" level.

Here, the output "L" level is compared with output potential VOL of the reference potential generating circuit 88 by a comparator 86 and a counter 87 is counted up or down depending on which is larger or smaller. Binary output SN of the counter 87 controls active/inactive of the driving circuit 82 of each output buffer portion 80-0, 80-1, . . . . An effective size of the entire N-MOSFET can be in a range of WN0~$(2^{(i+1)}-1)$×WN0 (increments each WN0) because the size WN(k) of the k N-MOSFET is expressed as shown in the above formula.

The binary data SN produced in this manner is stored in the register B and transmitted to all the output buffer, and the size of the N-MOSFET is controlled/determined to be the same as the replica. As a result, the N-MOSFET size of the output buffer in which impedance matching with the transmission path is ensured can be determined.

By carrying out the above operation in the chip 2 as well, impedance matching with the transmission path can be obtained in all the chips.

Although this embodiment has been described only in a case of two chips, a case of branch/stub connection can be achieved by the same operation except that when the N-MOSFET size is determined, all the chips than an object chip are set to input mode. FIG. 10 shows an example of branch/stub connection of three chips.

In the same Figure, an impedance element corresponding to a resistor 95 of FIG. 9 is provided at each chip and impedance matching of the P-MOSFET is carried out at each chip (step S1). Next, the chip 1 is set to output mode and the chip 2, 3 are set to input mode (step S2). Then, impedance matching of the N-MOSFET of the chip 1 is carried out (step S3).

After that, the chip 2 is set to output mode and the chips 1, 3 are set to input mode (step S4). Then, impedance matching of the N-MOSFET of the chip 2 is carried out (step S5).

Further, the chip 3 is set to output mode and the chips 1, 2 are set to input mode (step S6). Then, impedance matching of the N-MOSFET of the chip 3 is carried out (step S7).

If the above sequence ends, the setting of the output impedance is completed. Before an actual operation mode, the reference potential is changed from logic L level (VDDQ/2) to VDDQ×¾.

Although the example of VDDQ termination has been taken in this embodiment, it is permissible to terminate the GND end. At this time, the size is determined in an order from the N-MOSFET to the P-MOSFET.

By preparing a sequencer containing the above respective operations in a chip, impedance matching can be ensured easily. This can be executed at the time of system boot or during ordinal operation, so that a high speed interface having an excellent quality capable of coinciding with an operating environment can be achieved.

Although this embodiment has been described taking a push-pull HSTL-type interface as an example, it is needless to say that impedance matching can be ensured easily so that a high quality interface can be achieved if the same operation is carried out in other terminating type interface.

As described above, according to the present invention, a terminating type high speed I/O interface can be achieved without mounting a terminating resistor on the board. As a result, system cost can be reduced largely and output current can be reduced. Therefore, power increase can be suppressed. At the time of branch/stub connection, parallel termination can be achieved easily.

Further, according to the present invention, an impedance of a driving element of the push-pull output buffer can be controlled so as to generate an appropriate output potential, so that a high-quality, high-speed interface can be achieved.

Further, impedance matching corresponding to a system operating environment can be executed.

It should be understood that many modifications and adaptations of the invention will become apparent to those skilled in the art and it is intended to encompass such obvious modifications and changes in the scope of the claims appended hereto.

What is claimed is:

1. An I/O interface circuit comprising:
   first and second push-pull output buffers each supplied with first and second potentials, respectively and each having an I/O node connected to first and second transmission paths, respectively;
   a switch element connected between the I/O nodes of said first and second push-pull output buffers,
   wherein when an input mode for inputting a signal from said first and second transmission paths is selected, said switch element is turned on.

2. A semiconductor chip comprising:
   an I/O interface circuit including a push-pull output buffer having:
      a first driving element connected between an I/O node connected to a transmission path and a first potential node to which a first potential is applied; and
      a second driving element connected between a second potential node to which a second potential is applied and said I/O node, wherein an on/off status of said first and second driving elements are controlled to correspond to an input mode for inputting a signal from said transmission path and an output mode for outputting a signal to said transmission path, wherein said first or second potential is a terminal potential and, when said input mode is selected, a driving element of said first and second driving elements, which is connected to a potential node of said first and second potential nodes to which the terminal potential is applied, is turned on;
   a replica of said push-pull output buffer;
   a reference potential generating circuit for generating an output logic potential;
   a first element impedance adjusting circuit for comparing a potential appearing in an output end of said replica with the output logic potential of said reference potential generating circuit and for adjusting an impedance value of the first driving element in said push-pull output buffer according to a result of the comparison; and
   a second element impedance adjusting circuit for comparing the output logic potential of said transmission path with the output logic potential of said reference potential generating circuit and for adjusting an impedance value of the second driving element in said push-pull output buffer according to a result of the comparison.

3. A semiconductor chip according to claim 2 further comprising an impedance element connected between the output end of said replica and said second potential and having an impedance equal to an impedance of said transmission path.

4. A semiconductor system comprising:
   a plurality of semiconductor chips connected to one another through a transmission path, each semiconductor chip comprising:
      an I/O interface circuit including a push-pull output buffer having:

a first driving element connected between an I/O node connected to said transmission path and a first potential node to which a first potential is applied; and a second driving element connected between a second potential node to which a second potential is applied and said I/O node, wherein an on/off status of said first and second driving elements are controlled to correspond to an input mode for inputting a signal from said transmission path and an output mode for outputting a signal to said transmission path, wherein said first or second potential is a terminal potential and, when said input mode is selected, a driving element of said first and second driving elements, which is connected to a potential node of said first and second potential nodes to which the terminal potential is applied, is turned on;

a replica of said push-pull output buffer;

a reference potential generating circuit for generating an output logic potential;

a first element impedance adjusting circuit for comparing a potential appearing in an output end of said replica with the output logic potential of said reference potential generating circuit and for adjusting an impedance value of the first driving element in said push-pull output buffer according to a result of the comparison; and a second element impedance adjusting circuit for comparing the output logic potential of said transmission path with the output logic potential of said reference potential generating circuit and for adjusting an impedance value of the second driving element in said push-pull output buffer according to a result of the comparison; and a control circuit for sequentially controlling output impedances of first and second driving elements in said plurality of the semiconductor chips so as to match with an impedance of said transmission path.

5. A semiconductor system according to claim 6 wherein said control circuit is a sequencer for executing impedance matching at the time of boot and at a predetermined time.

6. A semiconductor chip comprising:

an I/O interface circuit including:
  a push-pull output buffer supplied with first and second potentials and having an output node connected to a transmission path; and
  a switch element connected between the output node of said push-pull output buffer and a third potential which is a terminal potential, wherein when an input mode for inputting a signal from said transmission path is selected, said switch element is turned on;

a replica of said push-pull output buffer;

a reference potential generating circuit for generating an output logic potential;

a first element impedance adjusting circuit for comparing a potential appearing in an output end of said replica with the output logic potential of said reference potential generating circuit and for adjusting an impedance value of a driving element connected to a potential node supplied with said first potential in said push-pull output buffer according to a result of the comparison; and a second element impedance adjusting circuit for comparing an output logical potential of said transmission path with the output logic potential of said reference potential generating circuit and for adjusting an impedance value of a driving element connected to a potential node supplied with said second potential in said push-pull output buffer according to a result of the comparison.

7. A semiconductor chip according to claim 6 further comprising an impedance element connected between the output end of said replica and said second potential and having an impedance equal to an impedance of said transmission path.

8. A semiconductor system comprising:

a plurality of semiconductor chips connected to one another through a transmission path, each semiconductor chip comprising:
  an I/O interface circuit including a push-pull output buffer supplied with first and second potentials and having an output node connected to the transmission path; and
  a switch element connected between the output node of said push-pull output buffer and a third potential which is a terminal potential, wherein when an input mode for inputting a signal from said transmission path is selected, said switch element is turned on;

a replica of said push-pull output buffer;

a reference potential generating circuit for generating an output logical potential;

a first element impedance adjusting circuit for comparing a potential appearing in an output end of said replica with the output logic potential of said reference potential generating circuit and for adjusting an impedance value of a driving element connected to a potential node supplied with said first potential in said push-pull output buffer according to a result of the comparison; and a second element impedance adjusting circuit for comparing an output logic potential of said transmission path with the output logic potential of said reference potential generating circuit and for adjusting an impedance value of a driving element connected to a potential node supplied with said second potential in said push-pull output buffer according to a result of the comparison; and a control circuit for sequentially controlling output impedances of said driving elements in said plurality of the semiconductor chips so as to match with an impedance of said transmission path.

9. A semiconductor system according to claim 8 wherein said control circuit is a sequencer for executing impedance matching at the time of boot and at a predetermined time.

10. A semiconductor chip comprising:

an I/O interface circuit including:
  first and second push-pull buffers each supplied with first and second potentials and each having an output node connected to first and second transmission paths; and
  a switch element connected between the output nodes of said first and second push-pull output buffers, wherein when an input mode for inputting a signal from said first and second transmission paths is selected, said switch element is turned on;

a replica of said first and second push-pull output buffer;

a reference potential generating circuit for generating an output logic potential; and an element impedance adjusting circuit for comparing a potential appearing in an output end of said replica with the output logic potential of said reference potential generating circuit and for adjusting an impedance value of a driving element connected to a potential node supplied with said first potential in said first and second push-pull output buffers according to a result of the comparison.

11. A semiconductor chip according to claim 10 further comprising an impedance element connected between the output end of said replica and said second potential and having an impedance equal to an impedance of said transmission path.

12. A semiconductor system comprising:

a plurality of semiconductor chips connected to one another through a transmission path, each semiconductor chip comprising:

an I/O interface circuit including first and second push-pull buffers each supplied with first and second potentials and each having an output node connected to first and second transmission paths; and a switch element connected between the output nodes of said first and second push-pull output buffers, wherein when an input mode for inputting a signal from said first and second transmission paths is selected, said switch element is turned on;

a replica of said first and second push-pull output buffer;

a reference potential generating circuit for generating an output logic potential; and an element impedance adjusting circuit for comparing a potential appearing in an output end of said replica with the output logic potential of said reference potential generating circuit and for adjusting an impedance value of a driving element connected to a potential node supplied with said first potential in said first and second push-pull output buffers according to a result of the comparison; and a control circuit for sequentially controlling output impedances of driving elements in said plurality of the semiconductor chips so as to match with an impedance of said transmission path.

13. A semiconductor system according to claim 12 wherein said control circuit is a sequencer for executing impedance matching at the time of boot and at a predetermined time.

14. An I/O interface circuit comprising:

a plurality of first push-pull output buffers connected in cascade and each having:

a first driving element connected between a first I/O node connected to a first transmission path and a first potential node to which a first potential is applied; and a second driving element connected between a second potential node to which a second potential is applied and said first I/O node;

a plurality of second push-pull output buffers connected in cascade and each having:

a first driving element connected between a second I/O node connected to a second transmission path and said first potential node to which the first potential is applied; and a second driving element connected between said second potential node to which the second potential is applied and said second I/O node; and a switch element connected between said first I/O node and said second I/O node, wherein when an input mode for inputting a signal from said first and second transmission paths is selected, said switch element turned on.

* * * * *